United States Patent [19]
Tuan et al.

[11] Patent Number: 5,266,514
[45] Date of Patent: Nov. 30, 1993

[54] METHOD FOR PRODUCING A ROUGHENED SURFACE CAPACITOR

[75] Inventors: Hsiao-Chin Tuan; Hsiang-Ming J. Chou, both of Hsin-Chu, Taiwan

[73] Assignee: Industrial Technology Research Institute, Hsincho, Taiwan

[21] Appl. No.: 994,501

[22] Filed: Dec. 21, 1992

[51] Int. Cl.$^5$ ............... H01L 21/70; H01L 27/00
[52] U.S. Cl. ............... 437/52; 437/60; 437/919
[58] Field of Search ............... 437/60, 919, , 47, 52

[56] References Cited

U.S. PATENT DOCUMENTS

| | | | |
|---|---|---|---|
| 5,037,773 | 8/1991 | Lee et al. | 437/60 |
| 5,049,517 | 9/1991 | Liu et al. | 437/52 |
| 5,068,199 | 11/1991 | Sandhu | 437/52 |
| 5,082,797 | 1/1992 | Chan et al. | 437/52 |
| 5,110,752 | 5/1992 | Lu | 437/47 |

FOREIGN PATENT DOCUMENTS

| | | |
|---|---|---|
| 1122149A | 5/1989 | Japan . |
| 3101261A | 4/1991 | Japan . |

OTHER PUBLICATIONS

"A Capacitor-Over-Bit-Line (COB) Cell with a Hemispherical-Grain Storage Node for 64Mb DRAMs" by M. Sakao et al. IEDM 1990 Technical Digest pp. 655-658

"Rugged Surface Poly-Si Electrode and Low Temperature Deposited Silicon Nitride for 64 MBIT and Beyond STC DRAM Cell" by M. Yoshimaru et al, IEDM 1990 Technical Digest pp. 659-662.

"Electrical Characterization of Textured Interpoly Capacitors for Advanced Stacked DRAMs", by P. Fazan et al. IEDM 1990 Technical Digest, pp. 663-666.

*Primary Examiner*—Robert Kunemund
*Assistant Examiner*—H. Jey Tsai
*Attorney, Agent, or Firm*—George O. Saile

[57] ABSTRACT

A new method to produce a microminiturized capacitor having a roughened surface electrode is achieved. The method involves depositing a first polycrystalline or amorphous silicon layer over a suitable insulating base. The silicon layer is either in situ heavily, uniformly doped or deposited undoped and thereafter heavily doped by ion implantation followed by heating. The structure is annealed at above about 875° C. to render any amorphous silicon polycrystalline and to adjust the crystal grain size of the layer. The polysilicon surface is no subjected to a solution of phosphoric acid at a temperature of above about 140° C. to partially etch the surface and cause the uniformly roughened surface. A capacitor dielectric layer is deposited thereover. The capacitor structure is completed by depositing a second thin polycrystalline silicon layer over the capacitor dielectric layer.

20 Claims, 2 Drawing Sheets

METHOD FOR PRODUCING A ROUGHENED SURFACE CAPACITOR

BACKGROUND OF THE INVENTION (1) Field of the Invention

This invention relates to the fabrication of integrated circuit devices and more particularly to a method of fabricating high density dynamic random access memory (DRAM) devices and the like.

(2) Description of the Prior Art

As DRAMs are scaled down in dimensions, there is a continuous challenge to maintain a sufficiently high stored charge per capacitor unit area. In order to construct high density DRAMs in a reasonable sized chip area, the cell structures have to change from the conventional planar-type capacitors to either trench capacitors or stack capacitors, in particular beyond the 4 Mbit DRAM era.

Recently a new concept has been advanced which calls for roughening the polycrystalline silicon surface of the capacitor electrode to increase the surface area. Several techniques for achieving a roughened surface of a polycrystalline silicon electrode layer have been suggested in U.S. Pat. No. 5,110,752 by C. L. Lu, and in technical papers by M. Sakao et al entitled "A CAPACITOR-OVER-BIT-LINE (COB) CELL WITH A HEMISPHERICAL-GRAIN STORAGE NODE FOR 64 Mb DRAMs" in IEDM 1990 TECHNICAL DIGEST pages 655-658; M. Yoshimaru et al entitled "RUGGED SURFACE POLY-SI ELECTRODE AND LOW TEMPERATURE DEPOSITED SILICON NITRIDE FOR 64 MBIT AND BEYOND STC DRAM CELL" in IEDM 1990 TECHNICAL DIGEST pages 659-662; and Pierre C. Fazan et al entitled "ELECTRICAL CHARACTERIZATION OF TEXTURED INTERPOLY CAPACITORS FOR ADVANCED STACKED DRAMs" in IEDM 1990 TECHNICAL DIGEST pages 663-666.

SUMMARY OF THE INVENTION

A principal object of the invention is to provide an effective and very manufacturable method of DRAM storage node fabrication for a capacitor device having an increased effective electrode surface area and the resulting capacitor structure.

Another object of this invention is to provide an new method for producing a roughened surface on a polycrystalline silicon surface for use in highly dense capacitor structures.

Yet another object of this invention is to provide a new more reliable method for producing high density DRAM devices and the resulting structure which features a new stacked capacitor structure.

In accordance with these objects of this invention, a new method to produce a microminiturized capacitor having a roughened surface electrode is achieved. The method involves depositing a first polycrystalline or amorphous silicon layer over a suitable insulating base. The silicon layer is either in situ heavily, uniformly doped or deposited undoped and thereafter heavily doped by ion implantation followed by heating. The structure is annealed at above about 875° C. to render any amorphous silicon polycrystalline and to adjust the crystal grain size of the layer. The polysilicon surface is no subjected to a solution of phosphoric acid at a temperature of above about 140° C. to partially etch the surface and cause the uniformly roughened surface. A capacitor dielectric layer is deposited thereover. The capacitor structure is completed by depositing a second thin polycrystalline silicon layer over the capacitor dielectric layer.

BRIEF DESCRIPTION OF THE DRAWINGS

In the accompanying drawings forming a material part of this description, there is shown.

DESCRIPTION OF THE PREFERRED EMBODIMENTS

Figure 1:
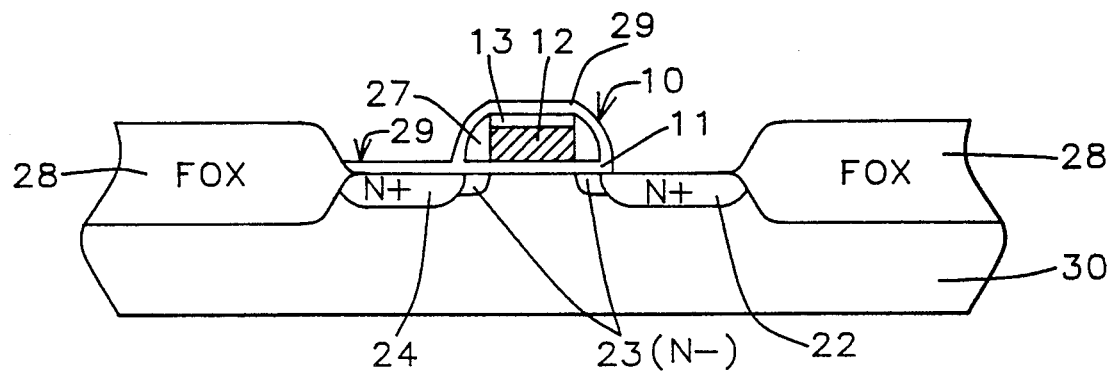
FIGS. 1, 2 and 3 schematically illustrate in cross-sectional representation one preferred embodiment of this invention.

Referring now to FIG. 1, there is illustrated a partially completed DRAM structure upon which the new capacitor structure of the invention will be fabricated. The first series of steps involve the formation of the dielectric isolation regions for isolating semiconductor surface regions from other such regions in the semiconductor substrate 30. The semiconductor substrate is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 28. Then semiconductor devices can be provided in the silicon mesas according to the following processes.

The surface of the silicon substrate 30 is thermally oxidized to form the desired gate oxide 11 thickness. The preferred thickness is between about 80 to 200 Angstroms. The polysilicon layer 12 is blanket deposited by LPCVD (Low Pressure Chemical Vapor Deposition) method. The preferred thickness of the polysilicon layer 12 is between about 1000 to 4000 Angstroms. The polysilicon layer 12 is ion implanted with phosphorous or arsenic ions under the conditions 5 to 10 E 15 dosage per $cm^2$ and 20 to 60 Kev. or doped with phosphorus oxychloride at a temperature about 900° C. The silicon oxide layer 13 is formed by on the surface 12 by a chemical vapor deposition process. The layers 11, 12 and 13 are patterned by conventional lithography and anisotropic etching techniques as are conventional in the art to provide a desired pattern of gate electrodes and structure on the FOX 28 surfaces or elsewhere as seen in FIG. 1.

The source/drain structure of the MOS FET may now be formed by the following steps. The FIG. 1 illustrates the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate.

FIG. 1, for example shows the ion implantations of N- dopants. Lithographic masks may be required to protect the areas not to be subjected to that particular N- ion implantation. The formation of the lithographic masks are done by conventional lithography and etching techniques. The N- lightly doped drain implantation 23 and 25 are done with, for example phosphorous P31 at a dose of between about 1 to 10 E 13 atoms/cm.$^2$ and with an energy of between about 30 to 80 Kev.

The dielectric spacer 27 is now to be formed followed by the completion of the lightly doped drain source/drain structures. A low temperature silicon oxide deposition is preferred such as through the chemical vapor deposition of tetraethoxysilane (TEOS) at a temperature in the range of between about 650° to 900° C. Other silicon oxide deposition methods include silane based LPCVD. The thickness of the dielectric silicon dioxide layer 27 is between about 1000 to 4000 Angstroms and preferably about 2500 Angstroms.

An anisotropic etching of this layer produces the dielectric spacer layer 27 on the sidewalls of the layer structures 11, 12, 13. The preferred anisotropic etching uses a conventional reactive ion etching ambient. The layer 29 is removed from the surface of the DRAM active drain areas as shown in FIG. 1 to form the capacitor node contact area.

The N+ source/drain ion implantation uses Arsenic, As 75 with a dose of between about 2 E 15 to 1 E 16 atoms/cm.$^2$ and energy of between about 20 to 70 Kev. to complete the source/drain regions 22 and the lightly doped N-drain regions 23 of the N channel lightly doped drain MOS FET integrated circuits device as seen in the FIG. 1.

A thin silicon dioxide, or the like masking layer 29 is formed upon the layer structure regions 11, 12, 13; the spacers 27 and the exposed monocrystalline silicon substrate regions. The conditions for forming this layer 29 are LPCVD deposition of TEOS or silicon based CVD silicon oxide deposition at about 650° to 850° C. The preferred thickness of this dielectric layer is between about 500 to 2500 Angstroms and a preferred thickness of about 1500 Angstroms. The layer 29 is then removed from the surface of the DRAM active drain areas as shown in FIG. 1 to form the capacitor node contact area.

Figure 2:
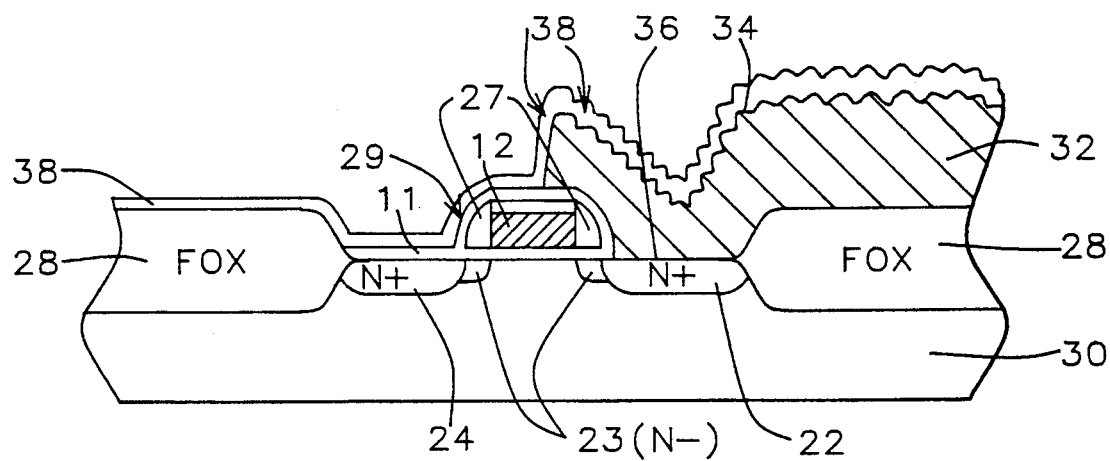

Referring now to FIG. 2, the capacitor structure is fabricated by depositing a first silicon layer 32 over the surface of the substrate 30 using the deposition technique of conventional LPCVD processing at a temperature of less than about 600° C. to produce an amorphous silicon layer. The thickness of the first layer is preferably between about 2000 to 5000 Angstroms. An impurity is introduced into the first silicon layer 32, either by ion implantation techniques or in situ doping. The impurity concentration in this first layer 32 is critically between about 1 E 19 to 1 E 21 atoms per cm.$^3$. Phosphorus, arsenic and boron dopants are effective for the subsequent phosphoric acid solution etching process. It is this heavy doping concentration throughout the surfaces to be subsequently etched with phosphoric acid which allows for the success of the present method of fabricating a storage node. The silicon layer 32 is now annealed by furnace or rapid thermal anneal at an elevated temperature of greater than about 875 and preferably more than 900° C. for, in the case of furnace anneal for a time greater than about 25 minutes to change any amorphous silicon in layer 32 to polycrystalline, uniformly distribute the dopant and develop the critical and desired grain size of the polycrystalline layer 32 to an average and substantially uniform grain size of between about 0.3 to 1.0 micrometers. This annealing process activates the dopants in layer 32 and causes the dopants to diffuse through the polysilicon film 32 and into the substrate 24 for an improved contact.

The layer 32 is patterned by conventional lithography and etching techniques to leave the layer 32 where the planned capacitor is desired.

The critical phosphoric acid solution etching process of the polysilicon layer 32 is now done to produce the roughened surface 34 of the invention as is shown schematically in FIG. 2. The surface of the polysilicon layer 32 has been carefully prepared as described in the above paragraph. This is extremely important to give the uniformity and manufacturability of this roughening etching process. The polysilicon etching rate with phosphoric acid solution at the critical temperature of between about 140° to 180° C. is reduced or slowed down after such a high temperature anneal as described in the preceding paragraph. The etching rate is dopant dependent and is between about 800 to 2000 Angstroms per hour for unannealed doped polysilicon and between about 200 to 800 Angstroms per hour for the critically annealed doped polysilicon layer. The etching rate after annealing is also more uniform. The critical composition of the phosphoric acid solution used is about $86+/-1.0\%$ H$_3$PO$_4$ and $14+/-1.0$ H$_2$O. The preferred etching rate is between about 500 to 800 per hour using phosphoric acid solution at a temperature between about 140 to 180 and preferably 150° to 170° C. for time sufficient to reduce the thickness of the polysilicon layer 32 by between about 500 to 800 Angstroms and to produce the roughened surface 34 as shown in FIG. 2.

Then a thin dielectric layer 38 is deposited. This layer serves as the capacitor dielectric. The thin dielectric or insulating layer has a thickness that is preferably in the range of about 30 to 250 Angstroms. The material of the dielectric layer can be of any suitable material having a high dielectric constant, and which forms a continuous, pinhole free layer. Preferably the dielectric layer is a composite layer of a silicon oxide-silicon nitride-silicon oxide with a total thickness of between about 40 to 150 Angstroms. Alternatively, and of particular importance for the future is the dielectric tantalum oxide, such as tantalum pentoxide or in combination with silicon dioxide and/or silicon nitride. The preferred thickness of tantalum oxide or tantalum pentoxide is between about 150 Angstroms to 1000 Angstroms.

Figure 3:
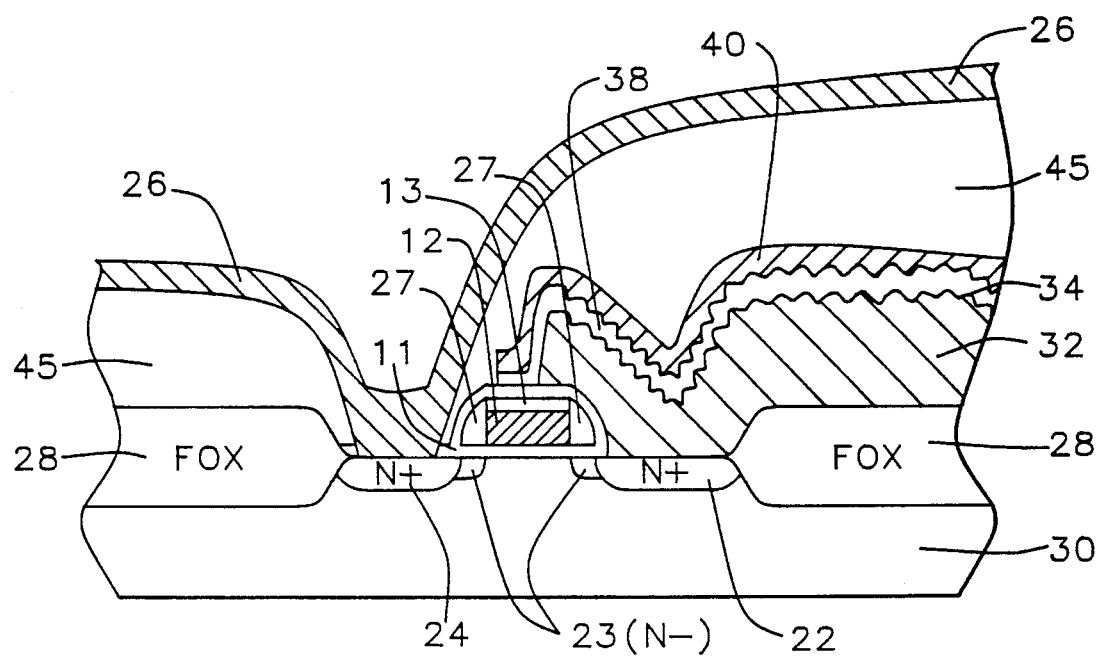

As shown in FIG. 3, a second polycrystalline silicon layer 40 is deposited over layer 34 and patterned to serve as the second electrode of the capacitor. The second polycrystalline silicon layer is also doped with an impurity, preferably with a concentration in the range of about 1 E 19 to 1 E 21 atoms per cm.$^3$.

FIG. 3 shows the completion of the metal contacts to the monocrystalline silicon regions such as the bit line 26 contact to source regions 24. An insulating structure 45 may be composed of, for example a layer of silicon dioxide and a much thicker layer of borophosphosilicate glass, phosphosilicate glass or similar insulating layer. The operational thicknesses of these layers are between about 1000 to 2000 Angstroms for the oxide layer and between about 2000 to 10,000 or more Angstroms for the glasseous layer. These layers are typically deposited by chemical vapor deposition in low pressure or atmospheric pressure, or in a plasma enhanced reactive chamber.

The contact windows or openings are now formed through the insulating layered structure to the source regions 24 or the like in the device regions. The openings are not shown to the other regions, because they are outside of the cross-section of FIG. 3. This process step is conventionally done by lithography and etching techniques which preferably use a reactive ion etching process that will anisotropically etch both components of the insulating layer structure 45. A typical reactive ion etching process using fluorine containing etching chemical species. These silicon oxide/glass layers etching processes are well known to those in the art. The size of the contact window opening can be as small as limitation of the etching and lithography patterning capability.

A bit line metal or composite metal layer or polycide composite layer (such as tungsten polycide) 26 is deposited over the exposed device region 24 and the insulating layer structure 45 both above and on the sides of the opening. This layer may be deposited by, for example chemical vapor deposition or sputtering. The operational thickness is between about 2000 to 10,000 Angstroms and the preferred thickness is between about 2000 to 4000 Angstroms. The thickness of this layer 26 is dependent upon the height and profile of the contact hole. This metal layer may be aluminum, aluminum-silicon, aluminum-silicon-copper, polycide, conductively doped polysilicon, tungsten or the like. Alternatively, a barrier metal layer (not shown) can be used under this metal layer.

The effective capacitor area, due to the roughened surface of the electrode, increases the electrical capacitance, per unit planar area, of the capacitor by at least 50%. The process is simple and effective, and is very manufacturable.

The following are examples which are intended to merely help in the understanding of the invention and not to limit the invention.

EXAMPLE I

A layer of undoped polysilicon was deposited by the CVD process as described above to a thickness of 3500 Angstroms at 620° C. on a silicon oxide layer covering a silicon wafer. The layer was doped using $POCl_3$ at a temperature of 950° C. for a time of 8 minutes in a diffusion furnace. The sample was cooled to room temperature. The wafer sample was then immersed into $H_3PO_4$ bath at a temperature of 160° C. for 90 minutes. The etching results recorded in TABLE I are average results from samples taken at 5 different locations on the wafer.

EXAMPLE II

A layer of polysilicon was (in-situ) doped with phosphorus during deposition, and deposited to a thickness of 1500 Angstroms at 675° C. on a silicon oxide layer covering a silicon wafer. The sample was cooled to room temperature. The wafer sample was then immersed into $H_3PO_4$ bath at a temperature of 160° C. for 100 minutes. The etching results recorded in TABLE I are average results from samples taken at 5 different locations on the wafer.

EXAMPLE III

A layer of undoped polysilicon was deposited to a thickness of 3500 Angstroms at 620° C. on a silicon oxide layer covering a silicon wafer. The sample was cooled to room temperature. The wafer sample was then immersed into $H_3PO_4$ bath at a temperature of 160° C. for 100 minutes. The etching results recorded in TABLE I are average results from samples taken at 5 different locations on the wafer.

EXAMPLE IV

A layer of undoped polysilicon was deposited to a thickness of 4500 Angstroms at 620° C. on a silicon oxide layer covering a silicon wafer. The sample was cooled to room temperature. The wafer sample was then immersed into $H_3PO_4$ bath at a temperature of 160° C. for 100 minutes. The etching results recorded in TABLE I are average results from samples taken at 5 different locations on the wafer.

TABLE I

| EXAMPLE | | thickness (Angstroms) | etching rate (Angstroms/hr) |
|---|---|---|---|
| I | before etch | 3258 | |
| | after etch | 2100 | |
| | etching loss | 1158 | |
| | Etching rate | | 772 |
| II | before etch | 1574 | |
| | after etch | 524 | |
| | etching loss | 1050 | |
| | Etching rate | | 630 |
| III | before etch | 4547 | |
| | after etch | 4529 | |
| | etching loss | 18 | |
| | Etching rate | | 11 |
| IV | before etch | 3658 | |
| | after etch | 3406 | |
| | etching loss | 252 | |
| | Etching rate | | 151 |

The results of the Examples I–IV show that phosphoric acid very effectively etches phosphorus oxychloride doped polysilicon and phosphorus in situ doped polysilicon. However, undoped polysilicon does not satisfactorily etch with phosphoric acid. Our conclusion is that phosphoric acid at about 160° C. can etch heavily phosphorus doped polysilicon. The etching rate is between about 600 to 800 Angstroms per minute.

EXAMPLES V–XII

Similar experiments have been performed for uniform and high dose doping with arsenic and boron using ion implantation sources of, respectively arsenic and boron difluoride. The results with doping levels of greater than about 1 E 19 atoms/$cm^3$. using phosphorus acid solution at 160° C. produced similar etching rates as with the phosphorus doping polysilicon Examples given above. The conditions and results of these Examples V–XII are shown in TABLE: Phosphoric Acid Etching Rate of Implanted Polysilicon as seen below.

TABLE

| Phosphoric Acid Etching Rate of Implanted polysilicon | | | | |
|---|---|---|---|---|
| Example | | thickness (Anstrong) | etching rate (Anstrong/hr) | Process Condition |
| V | before etch | 1925 | | As Imp, 80KeV, 5E15/$cm^3$ |
| | after etching | 1311 | | 900 C Annealing, 30 min |
| | etching loss in 75 min | 614 | 491 | |
| VI | before etch | 1925 | | As Imp, 80KeV, 5E15/$cm^3$ |
| | after etching | 280 | | No Annealing |
| | etching loss in 75 min | 1645 | 1316 | |
| VII | before etch | 1925 | | As Imp, 80KeV, 1E16/$cm^3$ |
| | after etching | 1098 | | 900 C Annealing, 30 min |

TABLE-continued

| | Phosphoric Acid Etching Rate of Implanted polysilicon | | | |
|---|---|---|---|---|
| Example | | thickness (Anstrong) | etching rate (Anstrong/hr) | Process Condition |
| | etching loss in 75 min | 827 | 662 | |
| VIII | before etch | 1925 | | As Imp, 80KeV, 1E16/cm 3 |
| | after etching | 274 | | No Annealing |
| | etching loss in 75 min | 1651 | 1321 | |
| IX | before etch | 1925 | | BF2 Imp, 60KeV, 5E15/cm 3 |
| | after etching | 1507 | | 900 C Annealing, 30 min |
| | etching loss in 75 min | 418 | 334 | |
| X | before etch | 1925 | | BF2 Imp, 60KeV, 5E15/cm 3 |
| | after etching | 733 | | No Annealing |
| | etching loss in 75 min | 1192 | 954 | |
| XI | before etch | 1925 | | BF2 Imp, 60KeV, 1E16/cm 3 |
| | after etching | 1550 | | 900 C Annealing, 30 min |
| | etching loss in 75 min | 375 | 300 | |
| XII | before etch | 1925 | | BF2 Imp, 60KeV, 1E16/cm 3 |
| | after etching | 916 | | No Annealing |
| | etching loss in 75 min | 1009 | 807 | |

While the invention has been particularly shown and described with reference to the preferred embodiments thereof, it will be understood by those skilled in the art that various changes in form and details may be made without departing from the spirit and scope of the invention.

What is claimed is:

1. A method to produce a roughened surface capacitor fabricated on a monocrystalline semiconductor substrate comprising:
   depositing a first silicon layer to form a first capacitor plate over a base insulating layer and a contact opening exposing said substrate;
   heavily doping said first silicon layer with an conductivity imparting impurity to a concentration greater than about 1 E 19 atoms/cm$^3$;
   heating said first silicon layer to assure uniform distribution of said impurity, optimum grain size of said silicon which is polycrystalline after said heating;
   subjecting the exposed surfaces of said first polycrystalline silicon layer to etching by phosphoric acid solution at a temperature above about 140° C. to thereby produce a roughened surface on said first silicon layer;
   depositing a insulating layer to form a capacitor dielectric layer over the surface of the roughened layer; and
   depositing a second polycrystalline silicon layer over said insulating layer to form the second capacitor plate and complete said capacitor.

2. The method of claim 1 wherein said first silicon layer is in situ doped with a phosphorus impurity in a concentration of between about 1 E 19 to 1 E 21 atoms/cm.$^3$.

3. The method of claim 1 wherein said first silicon layer is deposited undoped and then doped by ion implantation with a phosphorus impurity in a concentration of between about 1 E 19 to 1 E 21 atoms/cm.$^3$.

4. The method of claim 1 wherein said first silicon layer is deposited undoped and then doped by ion implantation with a arsenic impurity in a concentration of between about 1 E 19 to 1 E 21 atoms/cm.$^3$.

5. The method of claim 1 wherein said first silicon layer is deposited undoped and then doped by ion implantation with a boron impurity in a concentration of between about 1 E 19 to 1 E 21 atoms/cm.$^3$.

6. The method of claim 1 wherein said first silicon layer is deposited as amorphous silicon and is transformed into polycrystalline silicon during said heating.

7. The method of claim 1 wherein said first silicon layer is deposited as polycrystalline silicon and is transformed into a more uniform and optimum grain size during said heating.

8. The method of claim 1 wherein said heating is by furnace heating and is at a temperature of greater than about 800° C. for more than about 25 minutes to optimize the grain size to between about 0.3 to 1.0 micrometers.

9. The method of claim 1 wherein said first silicon layer is between about 2000 to 5000 Angstroms in thickness as deposited and said phosphoric acid etching removes between about 500 to 800 Angstroms of said first silicon layer during the process of roughening its surface.

10. The method of claim 9 wherein said phosphoric acid etching is performed under a temperature of between about 140° to 180° C.

11. The method of claim 10 wherein said phosphoric acid solution has a concentration of phosphoric acid in water of between about 85 to 87%.

12. A method to produce a MOS FET DRAM with a roughened surface capacitor fabricated on a monocrystalline semiconductor substrate comprising:
   depositing a first silicon layer to form a first capacitor plate over a base insulating layer and a contact opening exposing said substrate with one source/drain element of said MOS FET therein;
   heavily doping said first polycrystalline silicon layer with an conductivity imparting impurity to a concentration greater than about 1 E 19 atoms/cm.$^3$;
   heating said first silicon layer to a temperature of greater than about 800° C. to assure uniform distribution of said impurity, optimum grain size of said silicon which is polycrystalline after said heating;
   subjecting the exposed surfaces of said first polycrystalline silicon layer to etching by phosphoric acid solution at a temperature above about 140° C. to thereby produce a roughened surface on said first silicon layer;
   depositing a insulating layer to form a capacitor dielectric layer over the surface of the roughened layer;
   depositing a second polycrystalline silicon layer over said insulating layer to form the second capacitor plate and complete said capacitor; and
   electrically contacting the other source/drain element of said MOS FET therein.

13. The method of claim 12 wherein said heating is by furnace heating and is at a temperature of greater than about 850° C. for more than about 25 minutes to optimize the grain size to between 0.3 to 1.0 micrometers.

14. The method of claim 12 wherein said first silicon layer is between about 2000 to 5000 Angstroms in thickness as deposited and said phosphoric acid etching removes between about 500 to 800 Angstroms of said first silicon layer during the process of roughening its surface.

15. The method of claim 14 wherein said phosphoric acid etching is performed under a temperature of between about 140° to 180° C.

16. The method of claim 15 wherein said phosphoric acid solution has a concentration of phosphoric acid in water of between about 85 to 86%.

17. The method of claim 12 wherein said first silicon layer is in situ doped with a phosphorus impurity in a concentration of between about 1 E 19 to 1 E 21 atoms/cm.$^3$.

18. The method of claim 12 wherein said first silicon layer is deposited undoped and then doped by ion implantation with a phosphorus impurity in a concentration of between about 1 E 19 to 1 E 21 atoms/cm.$^3$.

19. The method of claim 12 wherein said first silicon layer is deposited undoped and then doped by ion implantation with a arsenic impurity in a concentration of between about 1 E 19 to 1 E 21 atoms/cm.$^3$.

20. The method of claim 12 wherein said first silicon layer is deposited undoped and then doped by ion implantation with a boron impurity in a concentration of between about 1 E 19 to 1 E 21 atoms/cm.$^3$.

* * * * *